United States Patent [19]

Hirvonen et al.

[11] Patent Number: 5,400,949
[45] Date of Patent: Mar. 28, 1995

[54] CIRCUIT BOARD ASSEMBLY

[75] Inventors: Timo Hirvonen, Salo; Ari Leman, Pertteli; Veli-Matti Valimaa, Salo; Petri Hossi, Salo; Jari Olkkola, Salo; Lasse Uronen, Salo, all of Finland

[73] Assignee: Nokia Mobile Phones Ltd., Salo, Finland

[21] Appl. No.: 183,577

[22] Filed: Jan. 18, 1994

Related U.S. Application Data

[63] Continuation of Ser. No. 945,607, Sep. 16, 1992, abandoned.

[30] Foreign Application Priority Data

Sep. 19, 1991 [FI] Finland .................................. 914416

[51] Int. Cl.6 .................... B23K 31/02; H05K 9/00
[52] U.S. Cl. .................... 228/180.22; 174/35 R; 361/818; 228/180.1; 228/234.1
[58] Field of Search ............... 174/35 R, 35 MS, 52.4; 361/816, 817, 818; 228/180.1, 180.21, 180.22, 234.1; 219/10.55 R, 10.55 D, 10.55 M, 129, 85.1, 85.12, 85.13, 85.14, 85.15, 85.2, 85.21, 85.22, 603, 615–616; 257/659, 660

[56] References Cited

U.S. PATENT DOCUMENTS

| 4,370,515 | 1/1983 | Donaldson | 174/35 R |
| 4,410,874 | 10/1983 | Scapple et al. | 338/307 |
| 4,517,738 | 5/1985 | Fukuoko et al. | 29/840 |
| 4,626,963 | 12/1986 | Speer | 361/424 |
| 4,838,475 | 6/1989 | Mullins | 228/179 |
| 4,839,774 | 6/1989 | Hamburgen | 361/383 |

FOREIGN PATENT DOCUMENTS

| 0262332 | 4/1988 | European Pat. Off. | H05K 9/00 |
| 92308478 | 11/1992 | European Pat. Off. | |
| 914416 | 6/1992 | Finland. | |
| 2629664 | 10/1989 | France | H05K 1/02 |
| 60-148158 | 8/1985 | Japan | 257/659 |
| 3206691 | 9/1991 | Japan | 174/35 R |

*Primary Examiner*—Bot Ledynh
*Attorney, Agent, or Firm*—Perman & Green

[57] ABSTRACT

A circuit board assembly including a shielding housing mounted on a circuit board (1), the shielding housing being intended for radio-frequency shieldings. The shielding housing (2) having a wall inclined at an angle α to a plane orthogonal to the plane of the circuit board. The housing of the circuit board assembly being suitable for at least a partial embedding into an exterior wall of an electronic apparatus.

1 Claim, 3 Drawing Sheets

CIRCUIT BOARD ASSEMBLY

This is a continuation of application Ser. No. 07/945,607, filed on Sep. 16, 1992, now abandoned.

The present invention relates to a circuit board assembly comprising at least one housing for shielding at least some of the components on a circuit board.

BACKGROUND OF THE INVENTION

Originally shielding was provided using RF tape. Thereafter housings made from a tinned steel sheet by bending and by soldering the corners were used. The housings were usually affixed to the circuit board manually, normally by manual soldering, the components being accessed by removing or opening the shielding housing.

Opening the shielding housings for inspection and tuning is no longer necessary due to the quality of the state of the art components. Tuning is also achieved by some method other than by turning screws beneath the cover, for example through software or in some other more economical manner.

The most significant characteristics of a housing are ease of assembly and minimum space consumption so that the components of an electronic device may be shielded in an assembly which is easy to manufacture and which may be located within as small a device as possible.

SUMMARY OF THE INVENTION

According to a first aspect of the present invention there is provided, a circuit board assembly, comprising a circuit board, electronic components mounted on the circuit board, and at least one housing, for interference shielding, comprising a top surface, a wall and means for attachment to a substantially flat substrate in which a portion of the wall is inclined relative to a plane orthogonal to the plane of the substrate; wherein the housing is mounted on the circuit board and encloses at least some of the electronic components.

In the circuit board assembly the shielding housing, together with the components beneath it, is soldered to the circuit board by soldering pins at its edges, for example by reflow soldering.

An important advantage of the invention is improved production. The work time required is considerably reduced.

The housing can also be embedded into the wall of the casing surrounding the assembly, such as the outer shell of a telephone, saving a considerable amount of space. The outer dimensions of the telephone are therefore reduced without weakening the flow characteristics of the wall in terms of casting techniques.

According to a second aspect of the present invention there is provided an electronic apparatus including a circuit board assembly further comprising an external wall portion, wherein the housing of said assembly is embedded at least partially in said external wall portion.

Even if two or more shielding housings were placed very close to each other and embedded into a wall, owing to the design of the shielding housings there will be left in the wall so-called flow channels which are advantageous in terms of casting techniques. Previously it has not been possible to embed the shielding housings into a wall as in such a case the wall will be weak and of a low visual quality.

BRIEF DESCRIPTION OF THE DRAWINGS

Embodiments of the present invention will now be described herewith, by way of example, with reference to the accompanying drawings, in which.

DETAILED DESCRIPTION OF THE INVENTION

Figure 1:
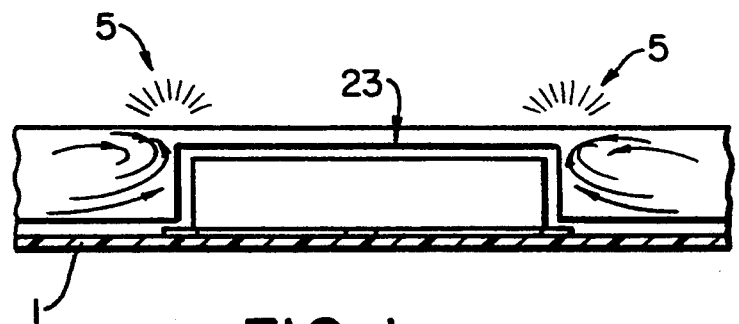
FIG. 1 depicts a prior art shielding housings embedded in a casing in which the wall portion is weak and of a low visual quality.

FIGS. 2 to 7 illustrate circuit board assemblies including housings 2 for providing shielding against radio frequency interference, comprising a top surface 21, a wall portion 22 and means 6 and 8 for attachment to a substantially flat substrate 1, in which the wall portion 22 is inclined, at an angle ($\alpha$) relative to a plane orthogonal to the plane of the substrate 1.

such a housing 2 may also be manufactured by deep drawing or punching and will be dimensionally highly precise, as compared with a housing made by bending metal. Also the requirement for the soldering of the corners of the housing is eliminated.

Furthermore, the structure is more rigid, which facilitates installation by machine, and the attachment of such a housing 2 can be easily automated. The design of the housing 2 enables the housing 2 to be stored in small spaces and at the same time in proper order considering automatic assembling. Owing to the shape of the housing, housings can be positioned very close to each other and soldered by manual soldering.

The angle ($\alpha$) of inclination from the vertical plane is approximately 20°–40°. The most preferred angle of inclination ($\alpha$) is 30°.

Figure 2:
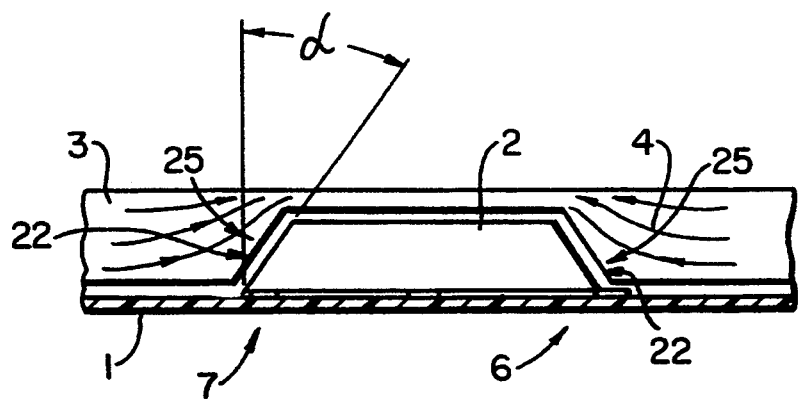
FIGS. 2 and 3 depict shielding housings according to the invention, embedded into a wall.
Figure 3:
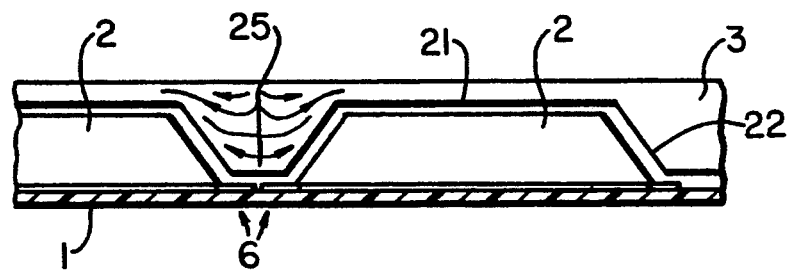

FIGS. 2 and 3 show a housing 2 embedded into the exterior wall 3 of a casing such as the outer shell of a telephone. Due to the shape of the housing 2, at the time of the casting of the exterior wall 3, the structural material can flow smoothly, in the manner indicated by the arrows 4, and thus as the material fills the space 25 around the inclined wall portion 22. A strong exterior wall 3 may be produced with the housing 2 embedded therein causing the wall thickness, along the top surface 21 of the housing 2 to be thin, the wall gaining strength from the thicker area 25 around the inclined wall portions 22. Therefore, the wall thickness is not excessive, as in the prior art exterior wall 31. The moulding is, furthermore, accomplished with substantially less eddying of the material, in which case the wall will be strong and outwardly visible surface quality flaws (FIG. 1, area 5) can be avoided.

Figure 8:
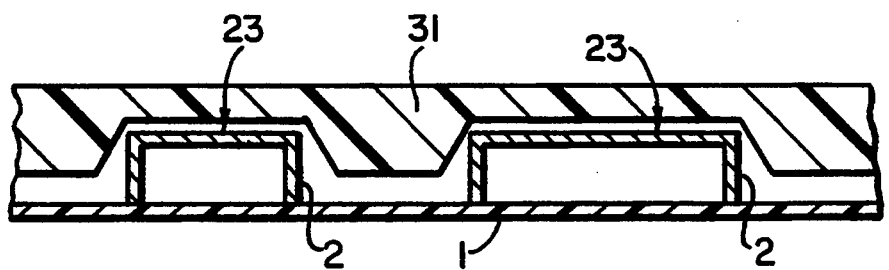
FIG. 8 depicts prior art rectangular housings are embedded into an exterior wall.

FIG. 8 illustrates a pair of prior art housing 21, as shown in FIG. 1, embedded in an exterior wall, and illustrates the fact that with the said housing 23 the outer exterior wall 31 must be thick to provide the required strength. Thus the prior art housing if embedded in the exterior wall 31 of a telephone will result in the exterior dimensions of the telephone being larger than that possible when the housing 2 is used, see FIG. 3.

Figure 6:
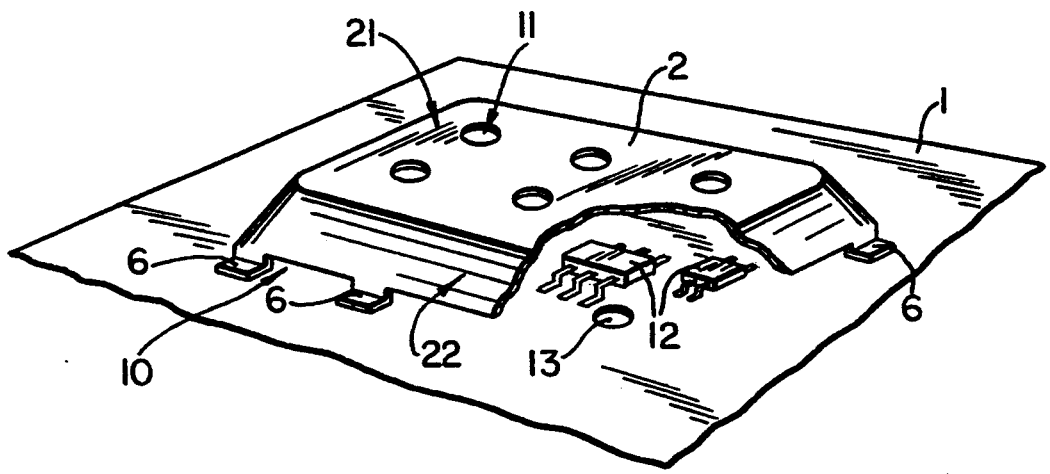
FIG. 6 depicts a partly cutaway view of a circuit board assembly including, components shielded by a circuit board within a housing in accordance with the present invention.
Figure 7:
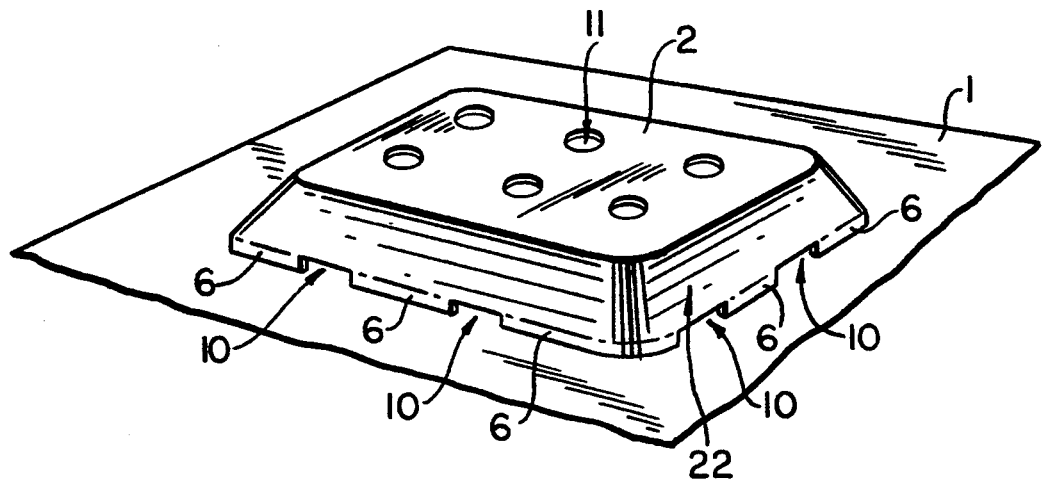
FIG. 7 depicts a shielding housing according to another embodiment of the present invention.

FIGS. 6 and 7 illustrate a circuit board assembly, comprising a circuit board 1 and a housing 2 for providing shielding against radio frequency interference, the housing comprising a top surface 21 a wall portion 22 and means 6 for attachment to the circuit board, wherein there are apertures 10,11,13 providing ventilation for the volume within the housing 2.

FIG. 6 illustrates an embodiment wherein the air apertures 13 are located in the circuit board, beneath the housing 2.

FIG. 7 illustrated an embodiment wherein the air apertures 10,11,13 are located in the housing. These air apertures 10,11,13 also serve as cooling holes, and these holes can be made use of in the automation of the production. It is simple to arrange in them so-called gripping points by which it is easy for an automatic device to "grip". If it is necessary to use different housings in a product, it is also easy, by different positioning of the holes 11, to provide automatic identification between the different shielding housings.

FIG. 7 also illustrates an embodiment wherein the air apertures 10 are located between the soldering pins 6 of the housing 2.

FIG. 2 illustrates an embodiment wherein the housing is soldered by a surface joint 7 to the surface of the circuit board i by soldering pins which are oriented outwardly from the edge of the housing. In a further embodiment the hounding 2 is surface mounted by soldering to the surface of the circuit board I by soldering pins 6, some or all of which are oriented inwardly from the edge of the housing.

In a further embodiment the housing 2 is surface mounted by soldering to the surface of the circuit board 1 by soldering pins the edges of which are perpendicular to the surface of the circuit board 1. Embodiments such as these thus allow more freedom in the design of the layout of the circuit board 1.

Figure 4:
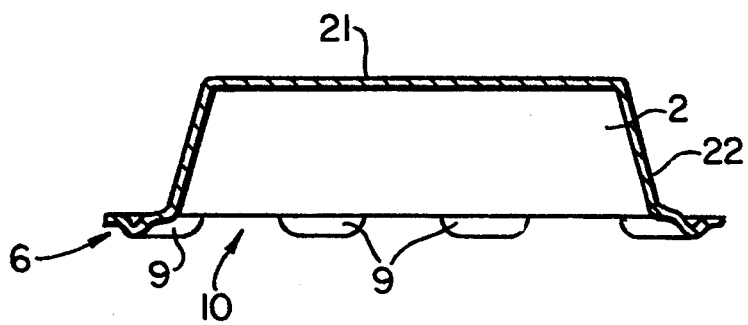
FIG. 4 depicts a cross section of a shielding housing according to one embodiment of the present invention.

FIG. 4 illustrates a still further embodiment of the invention in which the soldering pins of the shielding housing have soldering ridges 9. Thus necessary clearances for conductors (not shown), for example, are obtained at the lower edge of the housing 1.

The housing is soldered, simultaneously with the components inside it, to the circuit board, for example in a fellow kiln.

In FIG. 2, area 6, and in FIG. 3, the housing 2 has been surface-mounted by soldering to the surface of the circuit board 1 in such a manner that the grounding pins are oriented outwardly from the edge of the housing 2. Area 7 in FIG. 2 shows how the attachment means can also be oriented inwardly from the edge of the housing 2, in which case more freedom can be provided in the design of the layout of the circuit board.

Figure 5:
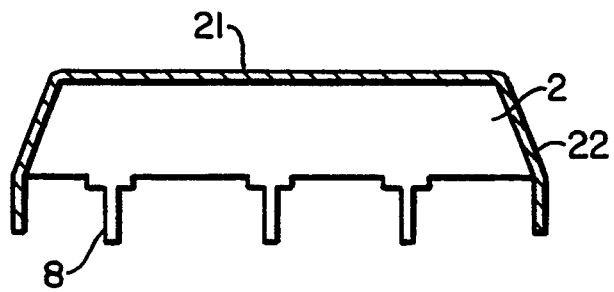
FIG. 5 depicts a cross section of a housing according to another embodiment of the present invention.

FIG. 5 depicts an embodiment in which the edge of the housing 2 has separate tags 8 passing through the circuit board 1. Thus the housing 2 can be soldered to the circuit board by these tags 8, namely the attachment means 6.

A further embodiment of the housing as shown in FIG. 4 has soldering ridges 9 in the attachment means of the housing 2 in such a manner that clearance holes 10 for conductors are left between the ridges 9. Also, the housing 2 may have cooling holes 11, normally in the top surface.

Ease of production is specifically improved because the housing design allows the housing to be soldered simultaneously with the components below it. The air apertures promote the transfer of heat at the soldering stage to the components beneath the shielding housing, and thereby the success of the soldering is ensured. Without such holes, reflow soldering is slow and uncertain. This means that soldering is achieved, but the heating time is much longer. Long-time high heat may be dangerous for the components used outside the shield. Providing such a long heating period in a hot-air reflow kiln may be difficult. Another advantage of the housing 2 is that handling can easily be automated in the same manner as the automatic installation of components on a circuit board.

The housing is preferably fabricated from metal sheet, in which case it will have all the properties desired. The housing 2 may also be made of some other electrically conductive material, and if a compromise is made regarding its EMI-shielding properties, also from an electrically non-conductive material.

In view of the foregoing description it will be evident to a person skilled in the art that modifications and improvements may be incorporated without departing from the scope of the present invention.

We claim:

1. A method of reflow soldering components to a circuit board comprising steps of:

positioning an interference shielding housing on the circuit board to enclose predetermined electronic components located on the circuit board, the housing having apertures extending through a top surface and located between the circuit board and a bottom edge of the housing and, a substantially solid inclined wall between the bottom edge and top surface that does not have holes; and heating the circuit board, electronic components and housing by use of hot air, wherein the hot air flows into the apertures at the bottom edge of the housing and out of the housing through the apertures at the top surface with a chimney-like air flow such that the hot air heats solder enclosed by the housing to thereby cause melting and reflow of the solder to simultaneously reflow solder the housing and the enclosed predetermined electronic components to the circuit board.

* * * * *